(12) United States Patent
Joffe et al.

(10) Patent No.: US 8,400,220 B1
(45) Date of Patent: Mar. 19, 2013

(54) QUIESCENT CURRENT CONTROL FOR CLASS AB OUTPUT STAGES

(75) Inventors: Daniel M. Joffe, Owens Crossroads, AL (US); Paul C. Ferguson, Riverton, UT (US)

(73) Assignee: Adtran, Inc., Huntsville, AL (US)

( * ) Notice: Subject to any disclaimer, the term of this patent is extended or adjusted under 35 U.S.C. 154(b) by 28 days.

(21) Appl. No.: 13/211,068

(22) Filed: Aug. 16, 2011

(51) Int. Cl.
*H03F 3/18* (2006.01)
(52) U.S. Cl. .................................... 330/264; 330/269
(58) Field of Classification Search .............. 330/264, 330/255, 267, 269
See application file for complete search history.

(56) References Cited

U.S. PATENT DOCUMENTS

| | | | | |
|---|---|---|---|---|
| 4,267,517 | A * | 5/1981 | Iida et al. | 330/253 |
| 5,113,148 | A * | 5/1992 | Theus | 330/253 |
| 7,057,459 | B2 * | 6/2006 | Ueno | 330/255 |
| 7,449,952 | B2 * | 11/2008 | Yu et al. | 330/255 |

OTHER PUBLICATIONS

Khumsat, Phanumas, "Two-Stage Feedforward CMOS OTA for Low-Voltage Filtering Applications", IEICE, Electron., vol. E90-C, No. 12 Dec. 2007, 4 pages.

Seevinck, Evert et al., "Generalized Translinear Circuit Principle", IEEE Journal of Solid-State Circuits, vol. 26, No. 8, Aug. 1991, 5 pages.

Yuhua, Cheng et al., "Analysis of Hybrid Translinear Circuit and Its Application", Engineering Letters, 14:1, EL_14_1_7 (Advcance Online Publications Feb. 12, 2007), 5 pages.

\* cited by examiner

*Primary Examiner* — Henry Choe
(74) *Attorney, Agent, or Firm* — Blakely, Sokoloff, Taylor & Zafman, LLP

(57) ABSTRACT

Quiescent current control for Class AB output stages is provided that is responsive to a sum of current of the pull-up and pull-down transistors in the crossover region, and responsive to a minimum of the pull-up or pull-down transistors otherwise. Replicating transistors operate responsive to activation of the pull-up and pull-down transistors. Additional circuit elements provide a summed current output that corrects for quiescent current variation, while having good operation over PVT variations, and having minimal distortive effects. Use of scaled replicating transistors reduces the current in the quiescent current control circuit. Additionally, a current limiter or topology change may be used to reduce current spikes in replication of the output stage current. Adjustment of a reference current can also prevent turning off a non-active output element to reduce the need to stew the element back on.

19 Claims, 6 Drawing Sheets

QUIESCENT CURRENT CONTROL FOR CLASS AB OUTPUT STAGES

FIELD

Embodiments of the invention relate to analog or digital drivers, and more particularly to controlling quiescent current for an output driver.

BACKGROUND

Quiescent current control schemes reduce the variation in quiescent current in Class AB output stages. Quiescent current control schemes can be divided into two types: 1) Open Loop and 2) Feed back types. This patent application describes a feedback type of quiescent current control.

The analog line driver on any line interface unit tends to use a lot of power relative to other parts of an integrated circuit, and is therefore a prime target for power reduction. Multiple design techniques have been employed in the past to achieve tighter control of the quiescent current of the amplifier. However, achieving the desired control while reducing the unintended effects (such as distortion) on the circuit is an ongoing challenge.

Quiescent current control schemes reduce the variation in quiescent current in Class AB output stages. The different approaches can be divided into basic types as follows: Type 1—relies on open loop arrangement to control quiescent current, and does not use feedback; Type 2—uses feedback to suppress variations in the quiescent current. Within the Type 1 (open loop) arrangements, sometimes non-linear elements are used to enhance quiescent current control at the cost of increased distortion. Within Type 2 (feedback arrangements), one must be careful to feed back the correct combination of the output stage signals to achieve close control of quiescent current without increasing distortion.

Each of the types of quiescent current control identified above reduces quiescent current variations, but suffers from one or more problems including not ensuring solid quiescent current over process, voltage, and temperature (PVT) process variations, causing crossover distortion or gain anomalies around the crossover region, and/or not maintaining minimum current in the non-active output device when the active device conducts heavily.

Circuits developed by Seevinck are of Type 2 (feedback), and work well in bipolar processes, while not suffering gain reduction in the crossover region. Seevinck accomplishes this by feeding back a current that is proportional to the minimum of the currents in the output devices. However, application of this approach to CMOS (complementary metal-oxide semiconductor) processes requires the use of bipolar transistors that are made within the CMOS process. Such bipolar transistors tend to be not very fast relative to the MOS transistors, and are typically not well-matched. The lack of speed in the CMOS-bipolar transistors requires them to be operated with higher currents than is desirable. The lack of matching limits the precision of the quiescent current control. The relatively small signals involved in the operation of the bipolar-based minimum circuits also limit the accuracy of the quiescent current control in CMOS amplifiers.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein. An overview of embodiments of the invention is provided below, followed by a more detailed description with reference to the drawings.

DETAILED DESCRIPTION

As provided herein, a quiescent current controller of a different type than those previously known can be used to control quiescent current for Class AB output stages. The approach uses a feedback signal proportional to the sum of the push and pull currents in the crossover region, and the minimum of either the push or pull current outside the crossover region. By feeding back the sum of push and pull current, the transconductance of the output stage in the crossover region is not dropped, which reduces the introduction of crossover distortion. It will be understood that the difference of push and pull currents creates useful output voltage, but a control signal based on the sum of push and pull currents is orthogonal to the difference of those currents, and so has no (or little) effect on the transconductance of the output stage.

Furthermore, in one embodiment, the quiescent current controller circuit is based on CMOS transistors rather than bipolar transistors. Thus, the quiescent current control provided herein allows tight control of quiescent current, small crossover distortion, and can be easily and inexpensively implemented with standard CMOS processes. The quiescent current controller provided herein offers low distortion, better speed, and more precise quiescent current control than any of the control types previously known.

The fact that the quiescent current controller can be implemented purely in CMOS allows for better speed and matching than would be possible by using the bipolar transistors typically available in a CMOS process. However, implementations in bipolar technology are also possible. As described herein, the quiescent current controller can provide consistent performance over PVT (process, voltage, and temperature)

variations, while introducing little to no crossover distortion or gain anomalies. Additionally, the quiescent current controller can maintain a minimum current in the non-active output device or output element when the complementary device conducts heavily.

Figure 1:
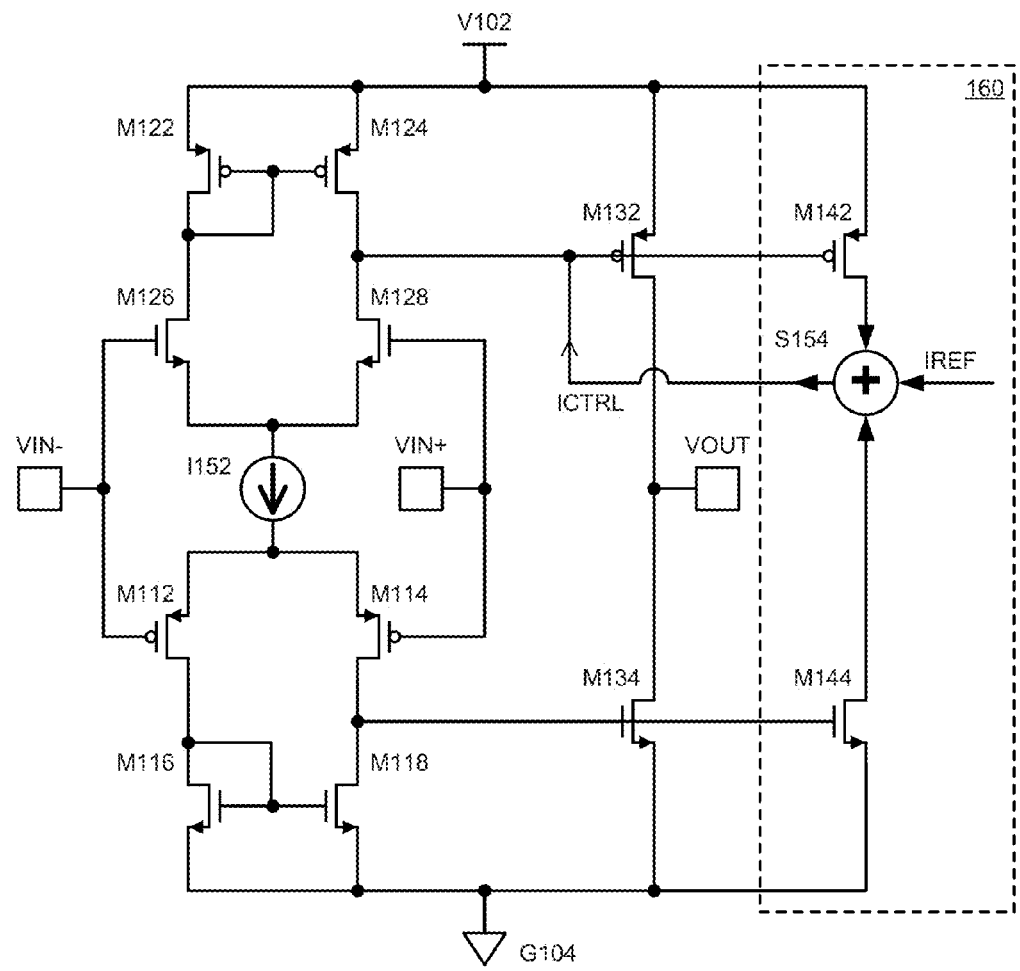
FIG. 1 is an embodiment of a class AB amplifier circuit with an idealized implementation of quiescent current control.

FIG. 1 is an embodiment of a circuit with quiescent current control. System 100 includes quiescent current control controller 160 to provide quiescent current control for the Class AB output stage of system 100. Class AB output stages are understood in the art, and therefore are not described in significant detail herein. Briefly, a Class AB output stage refers to a linear amplifier that has pull-up and pull-down output devices. The n-type device or n-channel output element or output transistor may be referred to as the "pull-down" device or pull-down element, while the p-type device or p-channel output element or output transistor may be referred to as the "pull-up" device or pull-up element. Assuming resistive loads, and for clarity of explanation, the pull-down device operates for portions of the output signal that are below a selected mid-level voltage, while the pull-up device operates for portions of the output signal that are above the selected mid-level voltage. Choice and control of quiescent or standing current is applied in the crossover region, which is for signals near the mid-level voltage.

Quiescent current controller (which may also be referred to as a quiescent current control system or as quiescent current control circuitry) 160 (or simply, controller 160) includes transistors M142 and M144, which are activated in parallel with output transistors M132 and M134, respectively. In one embodiment, M142 and M144 conduct scaled replicas of the currents conducted by M132 and M134, respectively. Controller 160 includes summing block S154 which includes a variety of elements to sum the currents of M142, M144, and reference current IREF or Iref to produce control current ICTRL or Icontrol. Additional details of possible implementations of S154 are included below in FIGS. 2A, 2B, 3, and 4.

In general it will be understood that the "summing block" represents a generic combination or interaction among the components. In the crossover region, a feedback signal proportional to the sum of the output currents is generated. In the active regions, a feedback signal proportional to the difference of the output currents. The feedback signal or signals generally attempt to bring the outputs to an equilibrium, which reduces offset signals, improving distortion control.

The basic circuit configuration in FIG. 1, system 100, is as follows. The left half of the Figure, excluding quiescent current controller representation 160, is a standard type of operational amplifier well known to those skilled in the art, M122, M124, M126, and M128 form a transconductor that drives pull-up device M132, M112, M114, M116, and M118 form a transconductor that drives pull-down device M134. The gains from the inputs (Vin+ and Vin−) to the gate of M134 and the gate of M132 is large enough that unavoidable offsets in the transconductors causes large variations in the quiescent current of M132 and M134.

Controller 160 is a simplified, high level representation of a quiescent current controller. Its inputs include a reference current, Iref, and the drain currents of M142 and M144. These drain currents are scaled replicas of the drain currents of M132 and M134. The summation or combining block indicates in a general way that the system provides a feedback signal Ictrl that depends on the reference current and the output device currents. Later sections provide more detailed examples of the summation or combining block, and show embodiments when Ictrl feeds back to more than one part of the amplifier.

As illustrated, the quiescent current control current is fed back to the control node of M132. In one embodiment, the control current can be fed instead to the control node of M134, similar to the example of FIG. 3 below. In an alternate embodiment, complementary control currents can be provided to both M132 and M134, similar to the example of FIG. 4 below.

Considering operation of system 100, first consider the case where there is no input signal and no offset. Assuming an ideal circuit with no offset voltage, Icontrol=0 when system 100 is at equilibrium. The currents in M144 and M142 are replicas of the currents in M134 and M132, respectively, and are equal. When one current is a replica of the other, it follows the current of which it is a replica. Such a current is generated by having a replicating transistor (or replicating transistor system) activated in parallel with the transistor that generates the current to be replicated.

Icontrol is the sum of the currents from M142 and M144 (which may be represented as Ids142 and Ids144, respectively) and Iref. Thus, Icontrol=Iref+Ids142+Ids144. Since at equilibrium Icontrol=0, Ids142=Ids144=−Iref/2. It will be understood that the connecting and summing elements of S154 to which M142 and M144 are connected may be different from each other.

The first assumption was equilibrium in system 100. The next assumption is that system 100 has an offset somewhere in the circuitry that results in an increase of current one of the output elements. Assuming an offset that results in an increase of current in M132, the following analysis illustrates how controller 160 compensates for mismatches. The increase of current in M132 is replicated in M142, which increases its current output in response to the output in M132. As Ids142 increases, Ids142 drifts away from −Iref/2, and Icontrol becomes positive. The positive current flows into the control node of M132 and causes the node voltage to rise. The rise of voltage at the control node in turn reduces Ids132. In response to the decrease in Ids132, Ids142 correspondingly decreases until Icontrol again becomes zero. The zero Icontrol occurs when Ids142 again approximates −Iref/2.

A similar analysis would show a similar effect for an offset that causes M134 to conduct. However, note a small distinction in that the feedback signal is fed back to M132. The reduction of M134 would occur due to an increase of current in M132 that causes Vout to return to equilibrium. The reduction of Ids134 may take longer than the reduction of Ids132, due to the indirect action of the feedback with respect to M134.

One final analysis illustrates the operation of controller 160 when a signal is introduced to system 100. Assume a positive input signal on Vin+. The voltage of the control node of M132 begins to drop due to conduction by M128 due to the positive voltage turning M128 on. Thus, Ids132 increases. At the same time, the voltage of the control node of M134 is decreasing due to the shutting off of M114—the shutting off of M114 causes M112 and M116 to conduct more, which causes a rise of the control node of M118, resulting in M118 turning on a corresponding amount that M114 is turning off. Thus, M118 pulls the control node of M134 down, resulting in a decrease of Ids134.

As Ids134 decreases, the replica or replicated current Ids144 decreases, while at the same time replica current Ids142 is increasing. The simultaneous current adjustment actions ensure that to the extent system 100 is linear, Icontrol remains zero. Thus, Icontrol remains zero despite the introduction of an input signal, which indicates that controller 160 is not activated by the input signal. Thus, the amplifier of system 100 operates as if controller 160 were not there. The fact that the amplification occurs independent of controller 160 indicates that the gain of the amplifier of system 100 is unaffected by controller 160, which is a highly desirable behavior.

As shown in the embodiment of FIG. 1, the system can be implemented with CMOS transistors, and certain notation is specific to the CMOS implementation (for example, referring to the currents as Ids, meaning the current from drain to source). It will be understood that other types of transistors could be used, such as BJT. Notation referring to the nodes of the transistor is intended to be generic to either MOS or BJT implementations. A control node is the node that controls the output function of the transistor, and could be a gate or a base. The output node is the node to which charge carriers of the transistor travel when the transistor is active. In n-type transistors the charge carriers are electrons, while in p-type transistors the charge carriers are holes, and the charge carriers move to the drain or collector of the transistor. The reference node is the node from which the charge carriers move, and is the source or emitter.

For simplicity in description, the examples provided herein illustrate FETs (field effect transistors), while it will be understood that other transistor types could be used. In accordance with the illustrated examples, the terms "gate", "source", and "drain" will be used in referring to the nodes of the various transistors. These descriptions are not limiting, and can be generally understood as referring to a control node, reference node, and output node, respectively.

It will be understood that system 100 can be implemented simply as presented in FIG. 1, or could be made more complex Thus, more circuit elements could be added to provide additional functionality. However, the basic circuit design illustrated provides the basic circuit operation, and additional elements and additional functionality would not alter the basic operation shown and described. Additional circuit elements could be added (e.g., parallel elements) to provide a specific implementation, such as using multiple, smaller parallel transistors instead of a large transistor, as is understood by those skilled in the art.

While reference has been made to the example of FIG. 1, a general summary without specific reference to the drawings follows. Quiescent current control circuitry reduces the variation in quiescent current of an output stage of a complementary output driver by feeding back the sum of push and pull current in the crossover region (and a minimum of push or pull otherwise). Given the feedback signal is responsive to the sum of the currents while the output is responsive to the difference of the currents, the gain of the output stage is not affected or is minimally affected in the crossover region; thus, the quiescent current controller described herein reduces crossover distortion as compared to known quiescent current control methods.

Replicating transistors operate responsive to activation of the pull-up and pull-down transistors of the output stage. Additional circuit elements provide a summed feedback current that corrects for quiescent current variation, while having good operation over PVT variations, and having minimal distortive effects. Use of scaled replicating transistors reduces the current used in the quiescent current control circuit. Additionally, a current limiter may be used to reduce current spikes in replication of the output stage current. Adjustment of a reference current can also prevent turning off a non-active output element to reduce the need to slew the element back on.

A feedback current can be provided to either or both of the control terminals of the output stage. In one embodiment, a feedback signal is provided to the control terminal of the pull-down transistor. Alternatively, it could be provided to the pull-up transistor. In one embodiment, feedback signals are provided to both the pull-up and pull-down transistors.

Figure 2A:
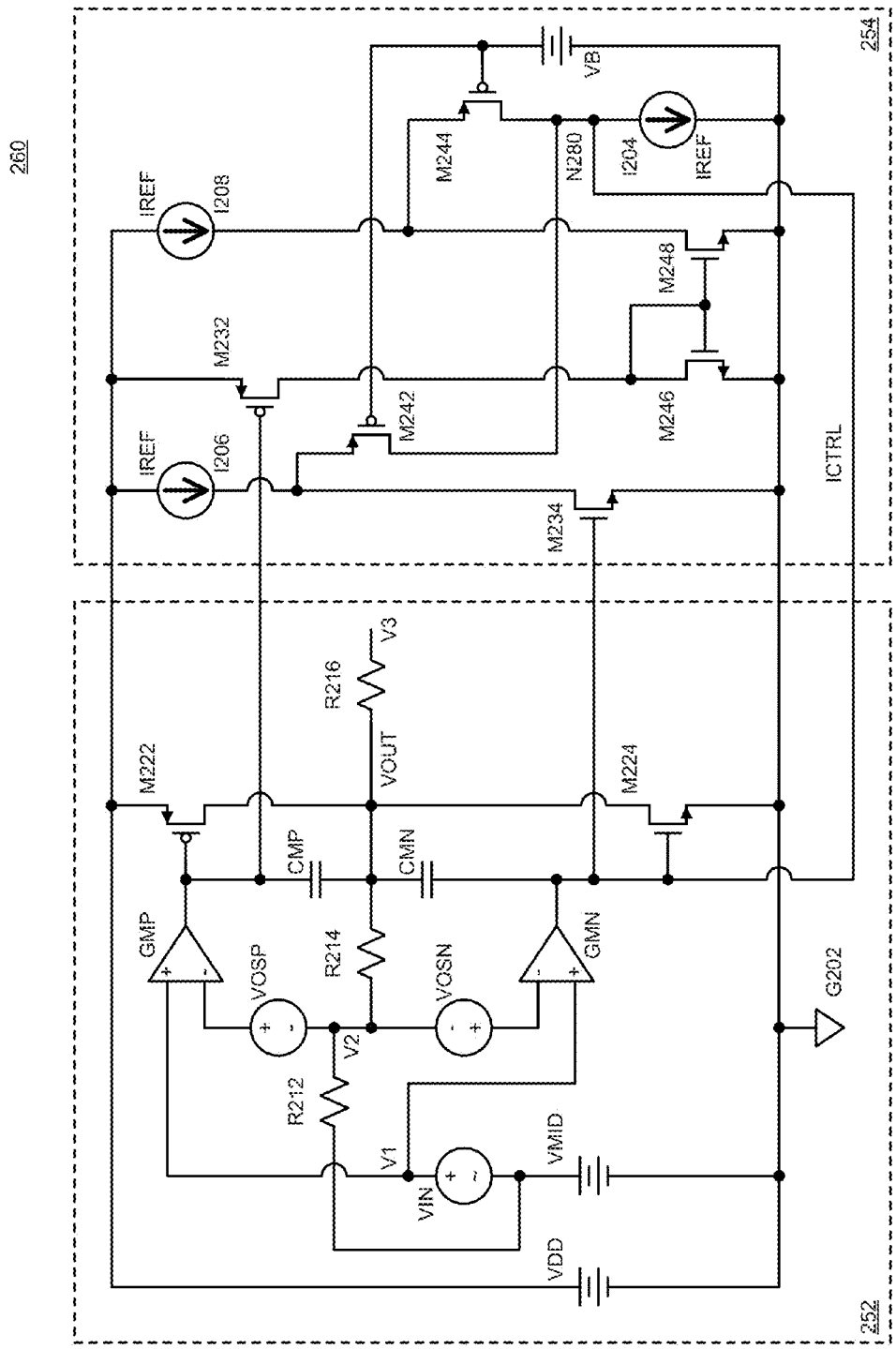
FIG. 2A is an embodiment of a circuit with quiescent current control for an output driver.
Figure 2B:
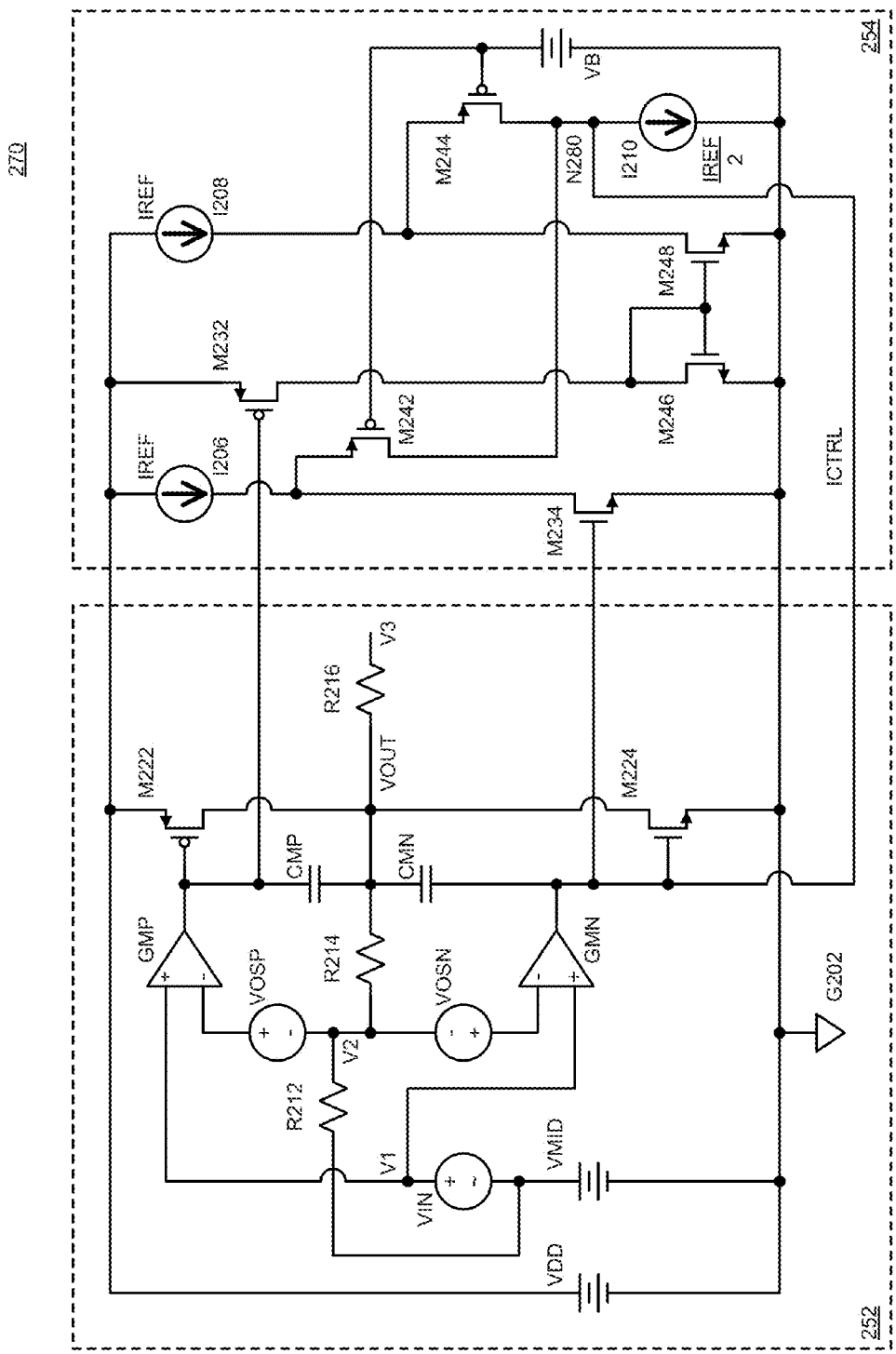
FIG. 2B is an embodiment of a circuit with quiescent current control for an output driver with output device cutoff control based on a smaller reference current.
Figure 3:
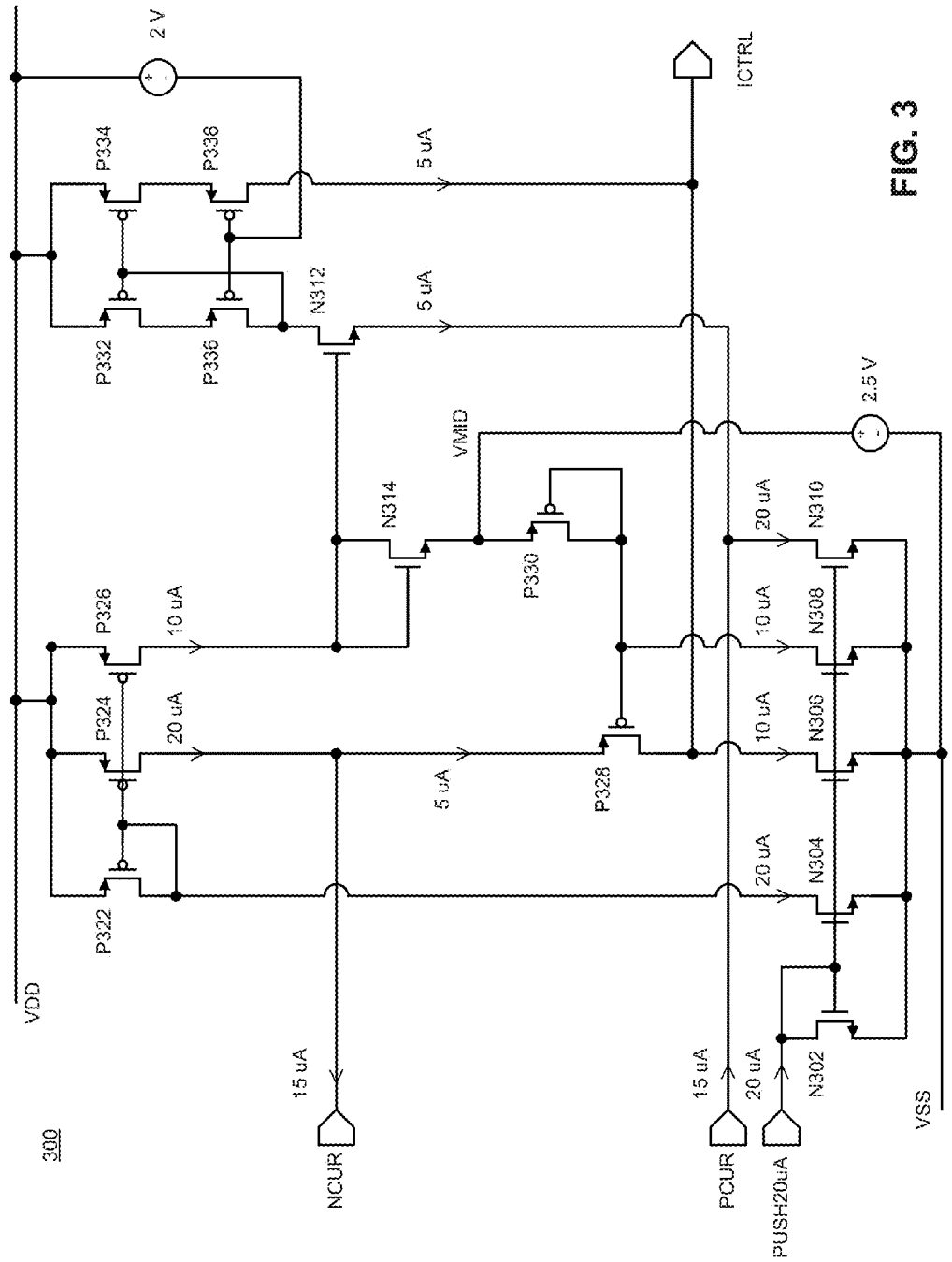
FIG. 3 is an embodiment of a quiescent current control circuit that produces a control current for a single output leg of a class AB driver.
Figure 4:
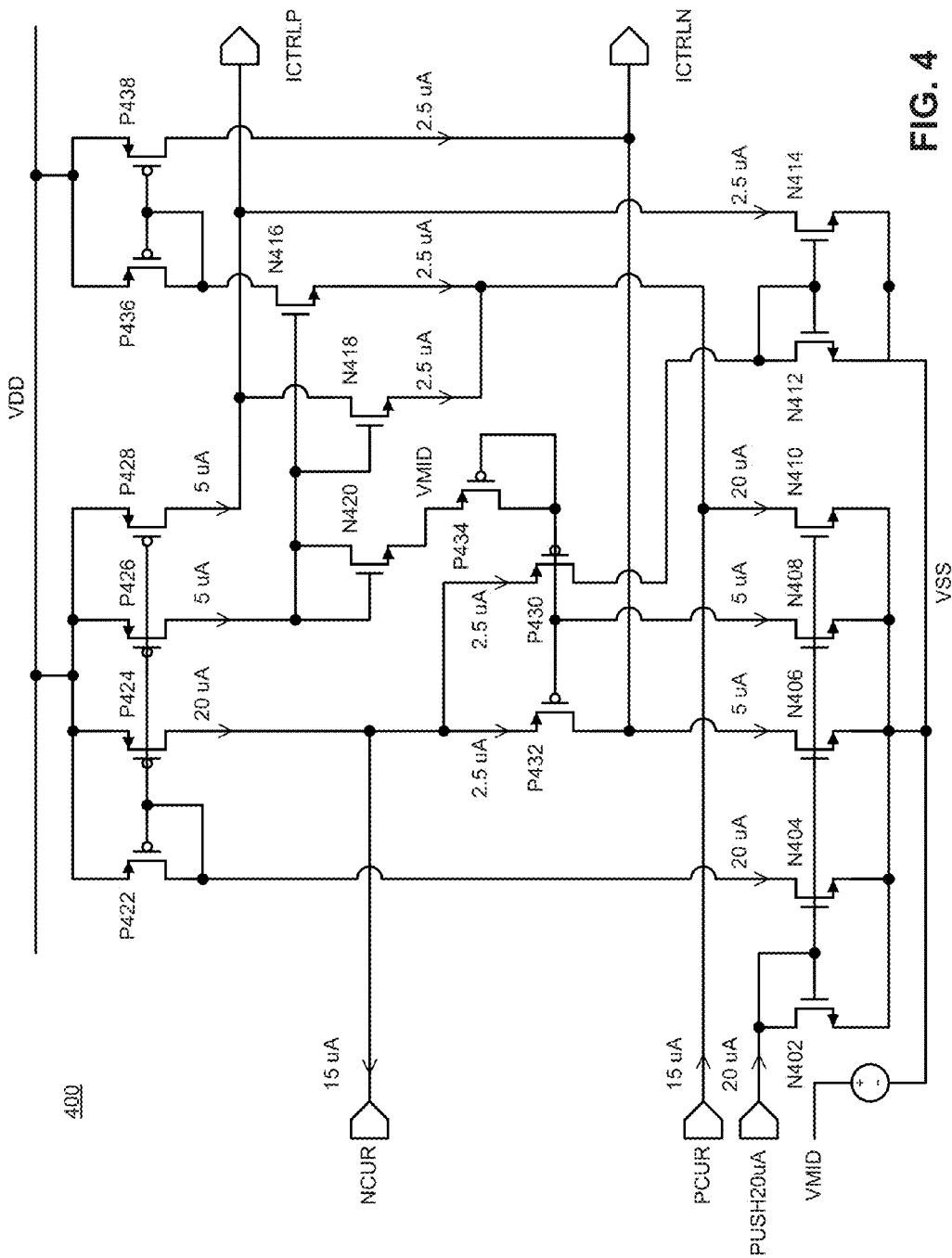
FIG. 4 is an embodiment of a quiescent current control circuit that produces control currents for both output legs of a class AB driver.

FIGS. 2A-2B show conceptual views of the quiescent current controller described herein. It will be understood that actual implementation of the control circuit could be different than what is shown (for example, FIGS. 3 and 4 provide implementation examples to realize the functioning of the quiescent current controller).

FIG. 2A is an embodiment of a circuit with quiescent current control for an output driver. The left half of system 260 (dashed area 252, or amplifier 252) illustrates a standard op-amp implementation that is understood in the art. The quiescent current control for amplifier 252 is illustrated in dashed area 254, or controller 254.

In one embodiment, amplifier 252 includes output transistors p-type M222 and n-type M224. The gate of M222 is driven by transconductor gmp, while the gate of M224 is driven by transconductor gmn. The drains of M222 and M224 are connected to R216 (which represents the load resistance). The drain currents of M222 and M224 produce Vout at the connection with R216. The other end of R216 is of potential V3, which may in one embodiment be Vmid=½ Vdd. The current through the load, IL, is the current through R216. The source of M222 is coupled to Vdd, and the source of M224 is coupled to G202, or the ground reference of system 260.

Miller capacitors are coupled between the drains of the output transistors and the gates. Thus, Cmp is coupled between the drain and gate of M222, and Cmn is coupled between the drain and gate of M224. R214 and R212 feed back a portion of the output voltage Vout to the inverting inputs of transconductors gmp and gmn. Input voltage Vin (voltage V1) is coupled to the noninverting inputs of transconductors gmp and gmn. This configuration is commonly known as the non-inverting operational amplifier configuration. The amplifier may also be used in other configurations. Vosp and Vosn represent the unavoidable offset voltages associated with transconductors gmp and gmn. These offset voltages necessitate the additional quiescent current control circuits to assure sufficiently tight control of quiescent current.

Controller 254 includes transistor p-type M232, which is activated in conjunction with output transistor M222, and transistor n-type M234, which is activated in conjunction with output transistor M224. These transistors operate responsive to the output currents to provide the feedback signal. M232 and M234 are activated in conjunction or in parallel with the output transistors by tying the gates of M232 and M234 to the gates of their respective output transistor, M222 and M224. In one embodiment, the source of M232 is coupled to Vdd, while the source of M234 is coupled to G202.

In one embodiment, the drain of M232 is connected to a diode connected transistor of a 1:1 current mirror. More specifically, the drain of M232 is connected to the drain and the gate of n-type M246. The drain of M232 is thus also connected to the gate of n-type M248 of the current mirror. The sources of M246 and M248 are coupled to G202. The drain of M248 is coupled to the output node of current source 1208 that generates a current of value Iref. The current mirror can be considered to provide a-1 gain, given that through the current mirror, activation of transistor M232 causes an equal amount of current to be drawn away from being conducted to node N280.

In one embodiment, the drain of M248 is also coupled to the source of p-type M244, which has its drain coupled to the source node of current source 1204 that generates a current of value Iref. The output node of 1204 is coupled to G202. The gate of M244 is coupled to voltage reference Vb, which biases M244 to conduct current whenever the source of M244 is not pulled low by conduction through M248. Conduction through M248 occurs responsive to activation of transistor M232.

Returning to transistor M234, in one embodiment, the drain of M234 is connected to the output node of current source I206 that generates a current of value Iref. The source node of I206 is connected to Vdd. The drain of M234 is also coupled to the source of p-type M242. The gate of M242 is also coupled to the voltage reference Vb, similar to the gate of M244. Similarly, Vb biases M242 to conduct whenever the source of M242 is not pulled low by conduction through M234. The source of M242 is pulled low responsive to activation of transistor M234. The drain of M242 is coupled to the drain of M244, and to the source node of I204. The connection point of the drains of M242, M244, and the source node of I204 may be referred to as node N280. N280 and components coupled to it may be considered the summing element (S154) of FIG. 1.

In one embodiment, the feedback current ICTRL or Icontrol is generated at the drains of M242 and M244, and is fed back to the gate of pull-down M224. An alternate circuit configuration feeding M234 into a current mirror could produce a feedback control current for the gate of the pull-up M222.

To describe the operation of system 260, consider first the quiescent current control problem of the uncontrolled circuit of amplifier 252. The control current provided by controller 254 brings the quiescent current under control.

To achieve low distortion, gmp and gmn should have high values of open loop voltage gain. However, high values of gain make the quiescent current of amplifier 252 especially sensitive to Vosp and Vosn, which represent offset voltages. Controller 254 reduces the sensitivity of the quiescent current of amplifier 252 to the offset voltages. Traditionally the controlling of the offset voltages is in conflict with the high gain of the transconductors. The conflict can be resolved with controller 254.

To analyze the operation of controller 254, consider a first case where IL=0. Assume for this example that Vin=0, which should result Vout=Vmid. Negligible current flows in R214 or R216 given that IL (the output current through R216) is equal to 0. Assume also that Vosn and Vosp are such that M222 and M224 are cut off. It will be understood that the based on the given assumptions, the following analysis is somewhat approximate based on an idealized look at the circuit for an instantaneous analysis. For example, where descriptions state that the control current goes to zero, it will be understood that the control current reduces, but in practice will not likely ever become zero. Description of the more general offset case follows the first case.

As a result of the assumptions above, M232 and M234 are also cut off. Given that M232 is not conducting, M246 and M248 of the current mirror are also cut off. Thus, M234 is not conducting, meaning all current from I206 flows through M242, resulting in the current at the drain of M242 equaling Iref (Id(M242)=Iref). Similarly, without conduction in M248, all current from I208 flows through M244, resulting in the current at the drain of M244 equaling Iref (Id(M244)=Iref). The statement for Icontrol is thus Icontrol=Iref+Iref−Iref=Iref.

Icontrol pulls up on the gate of M224, increasing the current in M224. The feedback action that keeps Vout=0 also results in increasing current in M222. The currents in M222 and M224 increase until Icontrol drops to zero.

Working backwards from Icontrol=0 shows that Icontrol goes to zero when Id(M242)+Id(M244)=Iref, meaning that the entire output of those transistors flows through I204. For the condition to exist where Id(M242)+Id(M244)=Iref, M234 and M232 must together conduct the remaining Iref that could otherwise flow to node N280. Thus, Id(M234)+Id(M232)=Iref.

However, it will be understood that Id(M232)=Id(M234), because the currents in M222 and M224 are similarly equal. Thus, it can be seen that Id(M232)=Id(M234)=Iref/2. In one embodiment, transistors M232 and M234 are scaled replicas (i.e., same geometry with different widths) of M222 and M224, respectively. If Id(M232)=Id(M234)=Iref/2, then it must be concluded that Id(M222)=Id(M224)=k*Iref/2, where k is the scaling factor. The quiescent current Iq is therefore given by Iq=k*Iref/2.

Thus, it can be seen that in the case of Vin=0, the feedback (or correction) current, Icontrol, establishes feedback that produces a well controlled quiescent current in M222 and M224. Additionally, it can be seen that for this case IL=0.

Now consider a second case where |IL|<Iq, and more specifically, Id(M222)<k*Iref and Id(M224)<k*Iref. Such a case occurs when an offset is introduced into the system. Thus, the current in one of the output devices is lower than in the first case, due to some offset in amplifier 252. Examining the behavior of M242 and M244 shows that M242 conducts current so long as M234 conducts less current than Iref, or Id(M234)<Iref. Similarly, M244 conducts current so long as Id(M248)<Iref, which means that Id(M232)<Iref. Thus, for output devices M222 and M224, it will be observed that for Id(M222)<k*Iref, Id(M244)>0, and 0 otherwise; and, for Id(M234)<k*Iref, Id(M242)>0, and 0 otherwise.

For the range of current in M222 and M224 less than k*Iref, Icontrol is given by the sum of whatever is conducted through M242 (Iref−Id(M234)), whatever is conducted through M244 (Iref−Id(M232)) minus the current in I204 (Iref). Thus, Icontrol=(Iref−Id(M234))+(Iref−Id(M232))−Iref=Iref+Iref−Iref+(Id(M232)+Id(M234))=Iref−(Id(M232)+Id(M234))=Iref−(Id(M222)+Id(M224))/k. Thus, the feedback current or feedback signal is proportional to the sum of the current of the output transistors M222 and M224, Id(M222)+Id(M224). Output signal Vout depends on the difference, Id(M222)−Id(M224). In this region, assuming high gain of the feedback system, the result is that Id(M222)+Id(M224)=k*Iref, and Id(M222)−Id(M224)=IL.

The quiescent current controller assures the first result. Transconductors gmn and gmp and their feedback assure the second result. The two feedbacks define two independent equations, and so the feedback loops coexist without interfering with each other.

Now consider a third case where Id(M222)>=k*Iref or Id(M224)>=k*Iref. Since both parts of the circuit behave similarly, consider only a single side. In this case, Id(M222)>=k*Iref is considered. This makes Id(M232)>Iref, making ID(M248)>Iref, dropping the source of M244 towards ground, cutting it off. This eliminates feedback from the heavily conducting pull up device. The lightly conducting device, M234, if it conducts at all, decreases Id(M242) below Iref, so that I204 pulls the gate of M224 low, cutting it off.

The behavior of controller 254 is discussed above. Additional considerations in designing and implementing the quiescent current control are now discussed in more detail.

In one embodiment, the feedback path from M222 and M224 to the insertion of the feedback signal Icontrol at the output of gmn is made to be relatively short. When active, it passes through a cascoded node that has low impedance and high bandwidth. The drain is compensated by the same Miller capacitor (Cmn) that compensates the main amplifier path.

The fact that the same Miller capacitor provides compensation makes the dynamics of the compensator quite well-behaved and straightforward.

Briefly reviewing the Miller compensation, it is understood that the Miller effect refers to the fact that a feedback capacitor from an output to an input of an amplifier will be seen at the input as having its value multiplied by the gain of the amplifier. Thus, for a value C, the feedback capacitor would be seen from the input as having a value A*C, where A is the numeric factor representing the gain of the amplifier. More precisely, the value is (1+A)*C, which is effectively A*C for values of (A)>>1, which is expected to be the case in most implementations.

The same Miller effect based dynamics work relative to the input of the feedback current as described above with respect to a predriver, thus indicating that the compensation for the input current is well-behaved in system 260.

In one embodiment, the gates of M222 and M224 have near minimum gate lengths with relatively wide gate widths. As a result, the output impedance of M222 and M224 is usually somewhat low. Even with gate length of approximately 0.35 microns, the drain current of an n-channel device increases about 27% between Vds=0.7 V and Vds=2.5 V. Such increases can contribute to quiescent current variations. Thus, if in designs where the dramatic limiting of the range of quiescent current variation is desired, Vb can be chosen to put the sources of M242 and M244 at Vmid when amplifier 252 is in the quiescent state. In one embodiment, M246 and M248 may be designed so that |Vds(M232)| is approximately Vdd/2.

Alternatively, controller 254 could be arranged with a current-to-current conversion where the input current for M232 was accepted at a voltage which followed Vout. Such a configuration would assure that M222 and M232 see the same Vds, eliminating the difference of Vds as an error source.

Further, the controller can reduce high frequency switching distortion. In one embodiment, the controller prevents M222 and M224 from becoming cut off. If M222 or M224 become cut off, there is distortion as the amplifier must slew the gates of the cut off device back into the active region before it can contribute to the output current.

In one embodiment, the selection of Iref is made based on both DC and AC constraints. More specifically, for DC, Iref can be chosen in relation to the available output current from gmn. In one embodiment, Iref is chosen to be large enough so that 1.5*Iref is adequate to cause the correct quiescent current to flow in the presence of the worst case Vosn and Vosp (see FIG. 2B below). Thus, the selection of Iref would be based on expected offset voltages, which depend on the device and process. Additionally, in one embodiment, Iref is chosen to be large enough to ensure that Iref/2 is adequate to cause the desired minimum current to flow in the non-active device, based on a design in accordance with that of FIG. 2B below.

For AC considerations, in one embodiment, Iref/2 is chosen to supply the current necessary for the gates to keep the non-active device on with the worst-case high-frequency high-amplitude signal.

The circuit configuration in controller 254 guarantees that the current through M234 will not exceed Iref. However, M232 is connected to the diode connected M246 of the current mirror. Thus, the current through M232 could potentially be much higher than Iref. The current through M232 could be limited without affecting circuit operation by providing current limiting in series with M232. In one embodiment, the current limiting is provided by a series resistor between the source and \kid. In one embodiment, the current limiting is provided by providing a p-channel current mirror, set to output 2*Iref from the drain of the current source to the source of M232. In one embodiment, current limiting is provided by making M246 of the current mirror physically small to limit how much current it can conduct. In one embodiment, current limiting is provided with a topology change to limit the current, such as illustrated in the example of FIG. 3.

FIG. 2B is an embodiment of a circuit with quiescent current control for an output driver with output device cutoff control. System 270 is very similar to system 260 of FIG. 2A, and the discussion of that section applies equally with respect to each of the components, with the exception of a reference current that feeds node N280. I204 in system 260 has its source node connected to node N280, and generates a current of a value of Iref. I210 In system 270, I210 has its source node connected to N280, and generates a current of a value of Iref/2. Thus, the equations above would be modified accordingly. The details of such an analysis are not described in detail, and they would be understood by one skilled in the art.

The change from Iref to Iref/2 can provide for faster response, for faster switching of the output stage of amplifier 252. It will be understood that a value of greater or less than ½ Iref could be used that is less than Iref, and the value could be chosen to satisfy AC and DC constraints similar to what is discussed above. The change to Iref/2 causes the average value of Icontrol to increase, which has the effect of keeping the non-driving output device on.

Assuming as before that M224 conducts so heavily that Id(M242)=0, the control current is given by Icontrol=Iref−Iref/2−Id(M222)/k (using the same analysis as above). Again based on the analysis above and using the high gain assumption, Id(M222)=k*Iref/2.

Thus, the change of I204 generating Iref to I210 generating Iref/2 can make the output stage faster by keeping the output devices from turning off. The change also shifts the quiescent current balance condition as follows: Icontrol=2*Iref−Iref/2−Id(M222)/k−Id(M224)/k. Assuming IL=0, solving for Icontrol=0 gives: 2*Iref−Iref/2−Id(M222)/k−Id(M224)k=0, which gives Id(M222)=Id(M224)=0.75*Iref*k.

Simply as a practical note, the basic principle is the same whether I210 is considered to generate Iref/2 while I206 and I208 generate Iref, or whether I210 is considered to conduct Iref and I206 and I208 are considered to generate 2*Iref. Thus, whichever value is considered half or double is a simple matter of scaling in the analysis, and only changes the terminology.

FIG. 3 is an embodiment of a quiescent current control circuit that produces a control current for a single output leg of a class AB driver. Circuit 300 represents a quiescent current controller that provides a control current to a gate of the n-type or pull-down element of an amplifier output stage. Elements of the amplifier are not shown.

Circuit 300 implements an embodiment of controller 254 of FIG. 2B, where I210 is connected to the node that generates Icontrol, and the current source draws Iref/2 away from the node. In the example illustrated in FIG. 3, let Iref=20 uA, and k=100, which predicts a current of 1.5 mA. The prediction is based on the fact that Iq=0.75*k*Iref when I210 generates Iref/2. A simulation of a circuit in accordance with circuit 300 showed good agreement with Iq=1.54 mA. The currents shown in FIG. 3 include direction and value, and are the currents that flow in the quiescent condition with Vosp=Vosn=0 in the amplifier controlled by circuit 300. To the extent that offsets are present, the output current is non-zero.

Analysis of circuit 300 reveals a somewhat different configuration than the basic layout of FIG. 2A. One change is the placement of the current mirror. The placement of the current mirror assures that even large currents in the output stage cause only limited currents in the controller. The currents are limited to a maximum of 20 uA.

The configuration is as follows. NCUR is a scaled replica of the current from the n-channel output element, while PCUR is a scaled replica of the current from the p-channel output element.

The current NCUR is connected to the drain of P324, which is in a current minor configuration with P322. P324 and P322 can be considered I206 of FIG. 2B. The sources of P322 and P324 are connected to Vdd, while their gates are connected. The gate and drain of P322 are connected to the drain of N304. M234 of FIG. 2B is not shown in FIG. 3, but is understood to be the source of NCUR. N304 produces a static current that is used to bias P322, and could be considered to be part of I206 of FIG. 2B. The source of N304 is connected to Vss, the low-voltage reference or ground of the circuit. The gate of N304 is connected to a 20 uA reference signal, PUSH20uA.

NCUR is also connected to P328, whose source is connected to the drain of P324. The drain of P328 is connected to ICTRL, which is a control signal for the n-channel output element. P328 may be considered to be M242 of FIG. 2B. The drain of P328 is also connected to the drain of N306, which can be understood as the current source I210 of FIG. 2B. N306 is coupled in parallel to N304, with the source of N306 coupled to ground and the gate coupled to PUSH20uA.

It will be seen that 20 uA is conducted through the current mirror of P322 and P324, due to the 20 uA flowing through N304. 5 uA flows through P328, and 15 uA flows back on NCUR. If an offset changes the value of NCUR, a change in current is replicated in the flow through P328, which then changes the value of Icontrol. The change is fed back to the gate of the n-channel output element to cause more or less current to flow through the output element, which in turn will reverse adjust the current conducted through P328 back to equilibrium.

P326 is coupled in parallel with P322 and P324, with its gate connected to the gates of P322 and P324, and its source coupled to Vdd. Current source P326 provides a 10 uA current that flows through N314, whose source is connected to reference voltage Vmid. N314 is connected as a diode, and sets up a reference voltage that is equal to Vmid plus one gate-source voltage. That bias voltage controls the gate of N312, whose source voltage is then approximately equal to Vmid. N312 operates in equivalent fashion to M244 from FIG. 2B, and the current mirror formed by P332, P334, P336, and P338 perform the same function as transistors M246 and M248 from FIG. 2.

N314 has its gate and drain connected to the drain of P326, and its source is connected to the source of P330. The connection of the two sources is kept at a value of Vmid, which as shown in the example embodiment of circuit 300 is 2.5 V. The gate and drain of P330 are connected to the gate of P328 and to the drain of N308. N308 is connected in parallel with N304 and N306, with its gate connected to PUSH20uA, and its source connected to Vss. Based on device scaling, P326 conducts half as much current as P322 and P324, 10 uA. The 10 uA biases N314 and N312, discussed below, and in the same fashion, the current from N308 biases P330 and P328.

The current from the p-channel output device PCUR is connected to the source of N312, and to the drain of N310. N302 and N310 create a current source, equivalent to I208 in FIG. 2B. In the absence of an input signal, the input current is 15 uA, which combines with 5 uA from N312 for a total of 20 uA flowing through N310. Any change in PCUR results in a corresponding change in the current through P312.

As mentioned above, N312 is biased with its gate connected to the drain of P326, and its drain is connected to the drain of P336 and the gates of P332 and P334. Transistor M232 of FIG. 2B is not shown in this schematic, but provides replica current PCUR as shown in FIG. 3. As mentioned previously, transistor N312 performs the same function as transistor M244 in FIG. 2B. It should be noted that the function of the control circuit is the same whether the signal-inverting current mirror is placed before or after the cascading transistors N312 from FIG. 3 or M244 from FIG. 2B.

The drain of P338 is connected to Icontrol. The gates of P336 and P338 are connected to a voltage source (e.g., a 2 V difference from Vdd), which biases them as cascoding transistors to increase the output impedance of the current mirror formed by P332 and P334. This configuration is known in the art as a wide swing cascode current mirror. A change in current flow in PCUR causes a corresponding change in flow in P338, which is then added to Icontrol, and fed back to the n-channel output element of the amplifier. The feedback action of the amplifier would cause the correction current to adjust the flow of current in the p-channel device indirectly from the direct control action at the n-channel device. Thus, a reverse adjustment would occur with PCUR until the current conducted through P338 returns to equilibrium.

As seen from the analysis above with FIG. 2B, the equation for the control current can be given as Icontrol=Id(M242)+Id(M244)−I210. To give a control current of zero, Id(M242)+Id(M244)=I210. For I210=Iref/2, Id(M242)=Id(M244)=Iref/4. Returning to FIG. 3, Iref=20 uA. Observe that in the quiescent conditions of circuit 300, Id(P328)=Id(P338)=5 uA, or Iref/4. Thus, it can be observed that the configuration of circuit 300 provides the function illustrated in system 252 of FIG. 2B. The output current, Icontrol is zero in the conditions shown, because the 5 uA of P328 and the 5 uA of P338 combine to supply the 10 uA (Iref/2) of N306.

As mentioned, circuit 300 provides only a correction current of gmn. Providing correction current for only gmn (or only for gmp) may provide adequate performance for the quiescent current controller, but tighter distortion control may be achieved by directly correcting the quiescent current of both gmn and gmp instead of relying on the feedback mechanism. Such a configuration is illustrated in FIG. 4.

By providing a quiescent current control feedback signal to both the pull-up and pull-down devices, the operation of the quiescent current control loop is more completely decoupled from the output control loop. In the case where the quiescent control signals are fed back to either the pull-up or pull-down devices, but not both, the output control loop must adjust the current in the device that does not receive quiescent current control feedback. If quiescent current control feedback is provided to both the pull-up and pull-down devices, then to the extent that the ratio of changes in quiescent current to gain matches in both paths, the action of the control signals cancels from the output signal. The canceling action is proportional to the difference of pull-up and pull-down currents. Thus, the quiescent current control signal can be completely non-affecting of the output signal path. This lowers the distortion in the output stage.

FIG. 4 is an embodiment of a quiescent current control circuit that produces control currents for both output legs of a class AB driver. Controller circuit 400 implements includes elements similar to circuit 300 of FIG. 3, with certain modifications related to providing both n-channel and p-channel feedback currents. Similar to the configuration of circuit 300, currents are limited to a maximum of 20 uA based on the configuration of circuit 400.

The configuration is as follows. NCUR is a scaled replica of the current from the n-channel output element, while PCUR is a scaled replica of the current from the p-channel output element.

More particularly, current NCUR is connected to the drain of P424, which is in a current mirror configuration with P422. P424 and the P422 may be considered a current source. The sources of P422 and P424 are connected to Vdd, while their gates are connected. The gate and drain of P422 are connected to the drain of N404. The source of N404 is connected to Vss, the low-voltage reference or ground of the circuit. The gate of N404 is connected to a 20 uA reference signal, PUSH20uA.

NCUR is also connected to the sources of P432 and P430, whose sources are connected to the drain of P424. The drain of P432 is connected to ICTRLN, which is a control signal for the n-channel output element. The drain of P432 is also connected to the drain of N406, which can be understood as a current source. N406 is coupled in parallel to N404, with the source of N406 coupled to ground and the gate coupled to PUSH20uA.

The drain of P430 is connected to diode connected N412, which is part of a current mirror with N414. Thus, the drain of P430 is connected to the drain of N412 and the gates of N412 and N414. The sources of N412 and N414 are connected to Vss. The drain of N414 is connected to ICTRLP, which is a control signal for the p-channel output element. The drain of N414 at ICTRLP is also connected to the drain of P428 and N418, discussed in more detail below.

It will be seen that 20 uA is conducted through the current mirror of P422 and P424, due to the 20 uA flowing through N404. 5 uA is split as 2.5 uA each flowing through P432 and P430, and 15 uA flows back on NCUR. If an offset changes the value of NCUR, a change in current is replicated in the flow through P432 and P430, which then changes the values of the feedback control currents. The change is fed back to the gates of the output elements to cause more or less current to flow through the output elements, which in turn will reverse adjust the current conducted through P432 and P430 back to equilibrium.

P426 is coupled in parallel with P422 and P424, with its gate connected to the gates of P422 and P424, and its source coupled to Vdd. The drain of P426 is connected to diode connected device N420, whose gate is thus biased at Vmid plus one gate-source voltage. The gate of N420 is connected to the gate of N418 and N416, whose source terminals are then biased at the same voltage as Vmid. In a similar fashion, the current from N408 flows through diode connected device P434, whose source is connected to Vmid. The gate of P434 is thus biased at Vmid minus one gate-source voltage. The gate of P434 is also connected to P432 and P430, whose source terminals are thus biased at the same voltage as Vmid. Based on device scaling, N426 conducts one-quarter as much current as P422 and P424, 5 uA. The 5 uA biases N416 and N418, discussed below, and P432 and P430, and flows through N408 in the quiescent condition.

The current from the p-channel output device PCUR is connected to the sources of N416 and N418, and to the drain of N410. N410 can be understood as being in a current mirror configuration with N402, conducting the reference current of 20 uA. PCUR is 15 uA, which combines with 2.5 uA from N416 and 2.5 uA from N418 for a total of 20 uA flowing through N402 and N410.

As mentioned above, N416 is biased with its gate connected to the drain of P436, and the gates of both P436 and P438. P436 and P438 are in a current mirror configuration, with their gates connected, and their sources connected to Vdd. The current from N416 is mirrored through P436 and P438 to ICTRLN. The source of N418 is connected to the source of N416, which as mentioned above are connected to the drain of N410. The drain of N418 is connected to the drain of P428, which is connected in parallel with P426. P428 has its gate connected to the gate of P426 (and the gates of P422 and P424), and its source connected to Vdd. The drain of P428 is connected to ICTRLP, and so it also connected to the drains of N418 and N414 (of the current mirror). The drain of P438 is connected to ICTRLN, and so is also connected to drains of P432 and N406.

Analysis of circuit 400 shows that a "balanced" feedback control system is established by splitting the replicating operations between the n-channel and p-channel feedback currents. Thus, whereas in FIG. 3, current was induced in the summing portion of the current through either an n-leg or a p-leg, in circuit 400, current induced by offset in either NCUR or PCUR will induce current in both ICTRLP and ICTRLN.

Observe that P426 and P428 together conduct 10 uA, which is conducted in comparable P326 of circuit 300. Instead of feeding only through a transistor that was activated in response to offset in circuit 300, the split current from P426 and P428 is fed through transistors to both ICTRLP and ICTRLN in response to a similar offset.

The splitting is effected by the connections with P432 feeding ICTRLN and P430 feeding ICTRLP in response to NCUR, while N418 feeds ICTRLP and P438 feeds ICTRLN in response to PCUR. Thus, in one embodiment, it could be understood that replicating operation occurs for both the p-channel and n-channel feedback signals for either an offset in the p-channel output element or an offset in the n-channel output element. In one embodiment, the splitting effect is provided through current mirrors to generate feedback that is inverted compared to the input current.

Figure 5B:
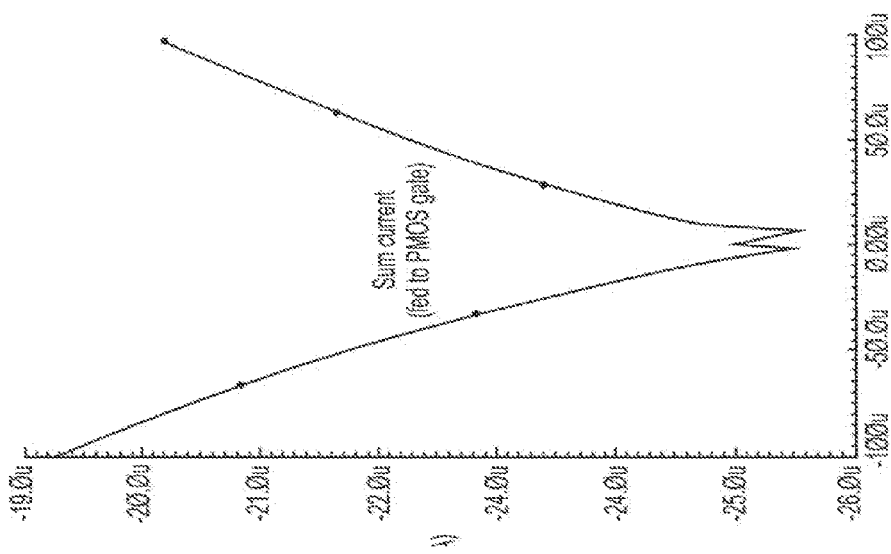
FIG. 5B is a simulation result for a quiescent control circuit.
Figure 5A:
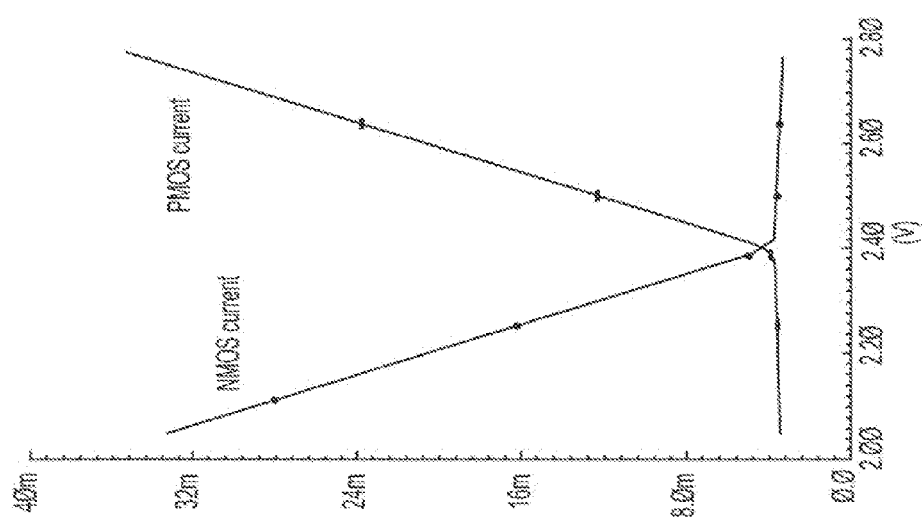
FIG. 5A is a simulation result for p-type and n-type currents as output voltage goes up or down from a nominal value.

FIG. 5A is a simulation result for p-type and n-type currents as output voltage goes up or down from a nominal value. The graph of FIG. 5A shows how the currents in the output elements operate as a function of output voltage. For the simulated circuit, the load resistor terminates to 2.4 V. Thus, when the output voltage (x-axis) is 2.4 V, the two curves cross. As current into the load increases, the PMOS current increases while the NMOS current remains nearly the same at near the quiescent current value, perhaps decreasing slightly, but preferably not cutting off. As the current out of the toad increase the NMOS current increases while the PMOS current remains nearly the same at near the quiescent current value, perhaps decreasing slightly, but preferably not cutting off.

FIG. 5B is a simulation result for a quiescent control circuit. The quiescent control current is generated in response to the n-type and p-type currents illustrated in FIG. 5A. Thus, the quiescent control current in the crossover region appears to be a sum of the output currents, which is exactly the operation described herein. The simulation illustrates that the summing is not entirely precise, and so there is some irregularity in the pattern. However, it will be understood that the quiescent control current compensates for a lot of non-ideal effects in the amplifier being controlled. The irregular pattern of the control current absorbs irregularity in the amplifier, making the overall circuit more linear, which dramatically drops the distortion of the amplifier.

In the no signal condition of the simulation provided, the quiescent current controller has an output current near 25 uA. By convention, currents are referenced into the controller, so the graph shows −25 uA. The quiescent current controller actually pushes 25 uA into the gate of the p-channel output transistor. In one embodiment, the current is fed back into an output of the stage that drives the p-channel output element.

By pushing current into that stage, it attempts to pull the gate up in voltage, which forces the p-channel output element to conduct less current. In simulation without the quiescent current controller, the p-channel output element current was observed to jump as high as approximately 400 mA. In contrast, with the quiescent current controller, the 25 uA sets the gate to its desired value, and prevents the quiescent current from reaching such high levels.

Turning now to the operation of the controller, observe first that the x-axis of FIG. 5A and the x-axis of FIG. 5B are actually the same. However, the x-axis of FIG. 5A is normalized to show the output voltage that is generated by the output current responsive to the input current, whereas the x-axis of FIG. 5B shows the input current.

In a standard Class AB amplifier, the p-channel current would drop off fairly quickly, and at some point would go to zero. The reason for the drop off is because the stage that drives the p-channel output element receives a negative signal, and so tries to turn off the p-channel output element. In the simulated quiescent current controller based on designs showed herein, the quiescent current controller first tries to keep the quiescent current small, but then eases off to just hold the p-channel output element current constant. Thus, the 25 uA eases off to 20 uA or so, and would continue if the plot illustrated a wider data set.

In the other direction, as the output voltage rises above 2.4 V, the p-channel output element turns on and conducts significant current. Some traditional current controllers would attempt to hold the current at the quiescent value, and the rest of the amplifier would be required to overpower it. Such an operation results in a loss of gain, since the controller is fighting against the amplifier. The summing controller described herein eases off again. Instead of trying to hold the p-channel output element at the quiescent level, the controller's current output "decreases" (recall that it is actually pushing current into the gate) and allows the voltage of the gate of the p-channel output element to drop. As the gate voltage drops, the p-channel output element turns on more and increases the output current. Thus, the operation of the summing controller does not drop the gain of the amplifier.

As described above, in one embodiment, feedback current can be provided to either or both gmp and gmn. A simulation of feedback to the n-channel output element would essentially be a vertical mirror or upside down version of FIG. 5B. The operation of the feedback is very similar, resulting in similar graphs with different polarity.

Various operations or functions are described herein, which may be described or defined as software code, instructions, configuration, and/or data. The content may be directly executable ("object" or "executable" form), source code, or difference code ("delta" or "patch" code). The software content of the embodiments described herein may be provided via an article of manufacture with the content stored thereon, or via a method of operating a communications interface to send data via the communications interface. A machine readable medium or computer readable medium may cause a machine to perform the functions or operations described, and includes any mechanism that provides (i.e., stores and/or transmits) information in a form accessible by a machine (e.g., computing device, electronic system, or other device), such as via recordable/non-recordable media (e.g., read only memory (ROM), random access memory (RAM), magnetic disk storage media, optical storage media, flash memory devices, or other storage media) or via transmission media (e.g., optical, digital, electrical, acoustic signals or other propagated signal). A communication interface includes any mechanism that interfaces to any of a hardwired, wireless, optical, or other medium to communicate to another device, such as a memory bus interface, a processor bus interface, an Internet connection, a disk controller. The communication interface can be configured by providing configuration parameters and/or sending signals to prepare the communication interface to provide a data signal describing the software content.

Various components described herein may be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications may be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A quiescent current controller, comprising:
a first replicating transistor to be activated in conjunction with activation of a pull-up transistor of a driver;
a second replicating transistor to be activated in conjunction with activation of a pull-down transistor of the driver; and
a control current output circuit to combine a reference current with current supplied from the first replicating transistor and current supplied from the second replicating transistor into a control current, and to output the control current for the driver with a value responsive to a sum of currents of the pull-up and pull-down transistors in a crossover region where both the pull-up and pull-down transistors are activated, and otherwise to output a value responsive to a minimum current of the pull-up and pull-down transistors.

2. The quiescent current controller of claim 1, wherein the first and second replicating transistors are related to their corresponding pull-up and pull-down transistors of the driver by a multiplication factor, the replicating transistors being a factor k smaller than their corresponding driver transistors.

3. The quiescent current controller of claim 1, wherein the control current is provided to a control terminal of the pull-down transistor.

4. The quiescent current controller of claim 3, further comprising a second control current output circuit to combine the reference current with current from supplied from a third replicating transistor responsive to the pull-up transistor and current supplied from a fourth replicating transistor responsive to the pull-down transistor into a second control current, the second control current to be provided to a control terminal of the pull-up transistor.

5. The quiescent current controller of claim 1, further comprising:
a first transistor biased to pass through at least a portion of current from a first current source whose value is the same as the reference current, until the first replicating transistor conducts current equal to the reference current, and then to be cut off; and
a second transistor biased to pass through at least a portion of current from a second current source whose value is the same as the reference current, until the second replicating transistor conducts current equal to the reference current, and then to be cut off.

6. The quiescent current controller of claim 1, further comprising:
   a first transistor biased to pass through at least a portion of current from a first current source whose value is twice the reference current, until the first replicating transistor conducts current equal to the reference current, and then to be cut off; and
   a second transistor biased to pass through at least a portion of current from a second current source whose value is twice the reference current, until the second replicating transistor conducts current equal to the reference current, and then to be cut off;
   wherein the current sources generating current whose value is twice the reference current prevents the pull-up transistor from turning off when the pull-down transistor drives the driver, and prevents the pull-down transistor from turning off when the pull-up transistor drives the driver.

7. The quiescent current controller of claim 1, further comprising:
   a current mirror, where the first replicating transistor is coupled to the diode connected transistor of the current mirror, the current mirror coupled between the first replicating transistor and the control current output circuit, to cause the first replicating transistor to reduce the control current responsive to activation of the first replicating transistor.

8. The quiescent current controller of claim 7, further comprising:
   a current-limiter in series with the first replicating transistor, to limit current generated by the first replicating transistor.

9. The quiescent current controller of claim 8, wherein the current-limiter comprises one of a series resistor between a reference node of the first replicating transistor and a voltage reference, a current mirror configured to output a current whose value is twice the reference current coupled between the voltage reference and the reference node of the first replicating transistor, or an output transistor of the current mirror with a geometry relatively small compared to the first replicating transistor to limit current flow.

10. The quiescent current controller of claim 8, wherein the current-limiter comprises a topology where the current mirror has transistors whose control nodes are connected to a control node of a transistor that has a limited current output.

11. A system comprising:
   an amplifier with a complementary output stage;
   a quiescent current controller coupled to the amplifier to provide a quiescent current control signal to the amplifier, the quiescent current controller to replicate output currents of n-channel and p-channel output elements of the amplifier, and generate the quiescent current control signal based on combining the replicated currents and a reference current in a crossover region where both the n-channel output element and the p-channel output element are active, and otherwise to generate the quiescent current control signal based on a minimum current of the n-channel output element and the p-channel output element.

12. The system of claim 11, wherein the complementary output stage and the quiescent current controller comprise complementary metal oxide semiconductor transistors.

13. The system of claim 11, wherein the quiescent current controller includes first and second replicating transistors related to corresponding n-channel and p-channel output elements a multiplication factor k, the replicating transistors being k times smaller than their corresponding output elements.

14. The system of claim 11, wherein the quiescent current controller is to feed the quiescent current control signal back directly to a control node of the output stage of the amplifier.

15. The system of claim 11, wherein the quiescent current controller is to feed the quiescent current control signal back to either the p-channel output element or the n-channel output element.

16. The system of claim 11, wherein the quiescent current controller is to feed two quiescent current control signals back to the amplifier, one to the p-channel output element and another to the n-channel output element.

17. The system of claim 11, wherein the quiescent current controller is to generate the quiescent current control signal by a current mirror coupled to a replicating transistor adding a current inverted relative to a replicated current of the replicating transistor.

18. The system of claim 11, the quiescent current controller further comprising:
   a current-limiter to limit current generated by replicating an output current of either the n-channel output element, or the p-channel output element, or both.

19. The system of claim 11, wherein the quiescent current controller is to generate the quiescent current control signal by combining the reference current of a value to prevent the p-channel output element from turning off when the n-channel output element drives an output of the amplifier, and to prevent the n-channel output element from turning off when the p-channel output element drives the output of the amplifier.

* * * * *